United States Patent
Maruyama

(10) Patent No.: US 8,941,290 B2
(45) Date of Patent: Jan. 27, 2015

(54) VIBRATING BODY AND VIBRATION WAVE ACTUATOR

(75) Inventor: Yutaka Maruyama, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 466 days.

(21) Appl. No.: 12/841,644

(22) Filed: Jul. 22, 2010

(65) Prior Publication Data

US 2011/0025168 A1 Feb. 3, 2011

(30) Foreign Application Priority Data

Jul. 28, 2009 (JP) ................................ 2009-174891
Jun. 21, 2010 (JP) ................................ 2010-140238

(51) Int. Cl.
 *H01L 41/187* (2006.01)
 *H01L 41/09* (2006.01)
 *H01L 41/314* (2013.01)

(52) U.S. Cl.
 CPC ........ *H01L 41/0906* (2013.01); *H01L 41/1876* (2013.01); *H01L 41/314* (2013.01)
 USPC .......................................... 310/358; 310/328

(58) Field of Classification Search
 USPC ........................................ 310/311, 328, 358
 See application file for complete search history.

(56) References Cited

U.S. PATENT DOCUMENTS

| | | | |
|---|---|---|---|
| 5,592,042 A | 1/1997 | Takuchi et al. | |
| 5,622,748 A | 4/1997 | Takeuchi et al. | |
| 5,691,593 A | 11/1997 | Takeuchi et al. | |
| 5,917,269 A | 6/1999 | Maruyama et al. | |
| 6,046,526 A | 4/2000 | Maruyama | |
| 6,183,669 B1 * | 2/2001 | Kubota et al. | 156/89.16 |
| 6,337,123 B1 * | 1/2002 | Ryugo et al. | 428/210 |
| 6,643,906 B2 | 11/2003 | Kitajima et al. | |
| 7,109,639 B2 | 9/2006 | Yamamoto et al. | |
| 7,187,104 B2 | 3/2007 | Yamamoto et al. | |
| 7,301,259 B2 | 11/2007 | Maruyama et al. | |
| 2001/0002807 A1 * | 6/2001 | Yoshida et al. | 333/187 |
| 2004/0012310 A1 | 1/2004 | Katakura et al. | |
| 2004/0046481 A1 * | 3/2004 | Takeuchi et al. | 310/311 |

(Continued)

FOREIGN PATENT DOCUMENTS

| | | | |
|---|---|---|---|
| JP | 61-103397 A | 5/1986 | |
| JP | 2842448 B2 | 1/1999 | |

(Continued)

OTHER PUBLICATIONS

English translation of Japanese Laid-open Patent Application No. 2009-124791.

(Continued)

*Primary Examiner* — Thomas Dougherty

(74) *Attorney, Agent, or Firm* — Fitzpatrick, Cella, Harper & Scinto

(57) ABSTRACT

Provided are a vibrating body and a vibration wave actuator, which can suppress vibration attenuation along with a reduction in size with an inexpensive structure, to thereby improve vibration efficiency, and can output stable vibration energy. A vibrating body includes: a piezoelectric element including a piezoelectric layer and an electrode layer; a ceramic substrate to which the piezoelectric element is fixed; and a ceramic layer including the same main component as a main component of the ceramic substrate, which is provided between the piezoelectric element and the ceramic substrate, and the piezoelectric element is fixed to the ceramic substrate through intermediation of the ceramic layer.

12 Claims, 3 Drawing Sheets

(56) References Cited

U.S. PATENT DOCUMENTS

| | | | |
|---|---|---|---|
| 2006/0108896 A1* | 5/2006 | Nanataki et al. | 310/324 |
| 2006/0108897 A1* | 5/2006 | Nanataki et al. | 310/324 |
| 2008/0098582 A1* | 5/2008 | Ohnishi et al. | 29/25.35 |
| 2012/0225197 A1* | 9/2012 | Ebigase | 427/77 |
| 2013/0334932 A1* | 12/2013 | Maruyama et al. | 310/348 |

FOREIGN PATENT DOCUMENTS

| | | | |
|---|---|---|---|
| JP | 2004-020396 A | | 1/2004 |
| JP | 2004-140193 A | * | 5/2004 |
| JP | 2006-74850 A | | 3/2006 |
| JP | 2006-229154 A | | 8/2006 |
| JP | 2007-123483 A | | 5/2007 |
| JP | 2009-124791 A | | 6/2009 |

OTHER PUBLICATIONS

English translation of Japanese Laid-open Patent Application No. 2009-124791 pub. date Jun. 4, 2009.

Office Action in Japanese Application No. 2010-140238, dated Mar. 18, 2014.

* cited by examiner

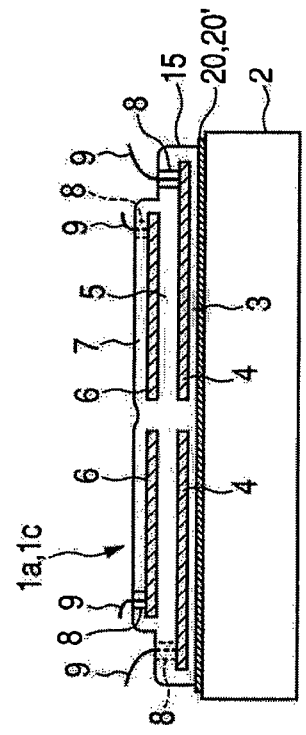
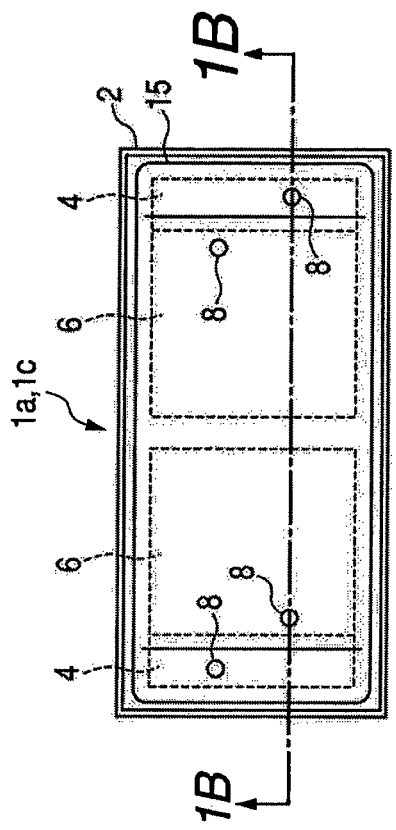
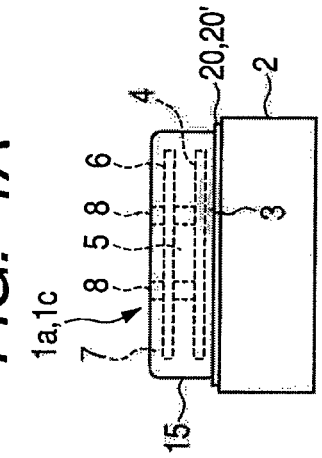

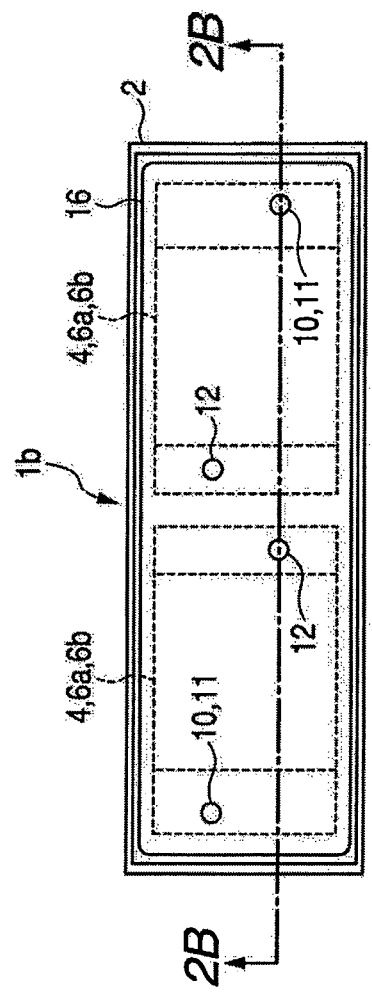
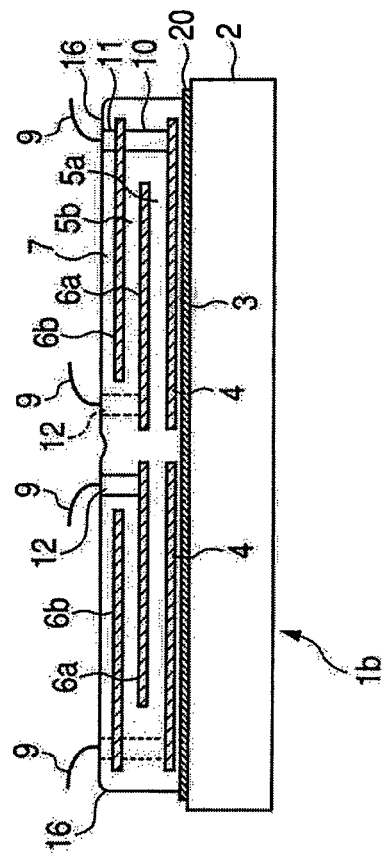
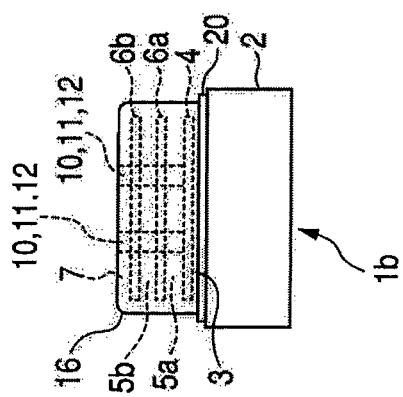

VIBRATING BODY AND VIBRATION WAVE ACTUATOR

BACKGROUND OF THE INVENTION

1. Field of the Invention

The present invention relates to a vibrating body and a vibration wave actuator, and more particularly, to a vibrating body including a piezoelectric element fixed to a ceramic substrate and a vibration wave actuator using the vibrating body.

2. Description of the Related Art

Conventionally, in a vibration wave actuator, a piezoelectric element is generally used as a vibration source for a vibrating body.

As the piezoelectric element, a laminated piezoelectric element is used (U.S. Pat. No. 7,109,639). The laminated piezoelectric element is obtained through laminating a large number of piezoelectric layers on each other and integrally molding the laminated piezoelectric layers before firing.

The laminated piezoelectric element has an advantage of obtaining, due to multi-layers thereof, larger deformation (strain) and larger force at low applied voltage as compared to a single plate-like piezoelectric element.

FIG. 4 is an external perspective view of a linear type vibration wave (ultrasonic wave) actuator 30 as described in U.S. Pat. No. 7,109,639.

The linear type vibration wave actuator 30 includes a vibrating body 31 and a linear slider 36 held in press contact with the vibrating body 31.

The vibrating body 31 includes a laminated piezoelectric element 35 and a driving plate 32. The laminated piezoelectric element 35 includes piezoelectric layers and electrode layers alternately laminated on each other. The driving plate 32 is made of a metal, and is adhered with an adhesive to the laminated piezoelectric element 35.

The driving plate 32 includes a rectangular-shaped plate portion and two protrusions 33a and 33b formed to protrude from an upper surface of the plate portion.

In distal end surfaces of the protrusions 33a and 33b, contact portions 34a and 34b are formed, respectively. The contact portions 34a and 34b are members to be brought into direct contact with the linear slider 36 serving as a driven member, and hence the contact portions 34a and 34b have abrasion resistance.

The linear type vibration wave actuator 30 excites two flexural vibration modes, and causes the protrusions 33a and 33b to perform oval motion.

The oval motion generates, with respect to the linear slider 36 held in contact with the vibrating body 31 under a pressed state, a relative-motion force between the linear slider 36 and the vibrating body 31.

Due to the relative-motion force, the linear slider 36 is linearly (straightly) driven.

For manufacturing the laminated piezoelectric element 35, a green sheet serving as the piezoelectric layer is first manufactured of piezoelectric material powder and an organic binder by a method such as doctor blade. In a predetermined position on the green sheet, an electrode material paste is printed to obtain the electrode layer.

Then, a predetermined number of the green sheets are superposed on each other to have a plane-shape as a whole, and are pressed to be laminated. After that, the piezoelectric layers and the electrode layers are co-calcined to be integrated to each other and are subjected to poling. Finally, the integrated piezoelectric layers and electrode layers are subjected to mechanical working to be finished to have a predetermined dimension.

Further, Japanese Patent No. 2,842,448 proposes the following piezoelectric/electrostrictive film-type actuator. Specifically, the electrode materials and the piezoelectric materials are stacked one by one in a layered manner on at least one surface of a ceramic substrate and are subjected to a heating process. In this manner, the piezoelectric/electrostrictive film-type actuator has an integrated layered structure.

In the above-mentioned vibration wave actuator of the conventional example illustrated in FIG. 4, the laminated piezoelectric element 35 and a vibrating plate (driving plate 32) made of metal are adhered to each other with an adhesive made of a resin. However, the adhesive made of the resin is relatively soft, and hence vibration attenuation due to the adhesive as the vibrating body is large. In particular, as the vibrating body becomes smaller in size, the effect of vibration attenuation of the vibrating body becomes larger, which is a main cause of decreasing efficiency of the small type vibration wave actuator.

Further, when the vibrating body becomes smaller in size, variation in a thickness of an adhesive layer and accuracy for positioning the adhesive to be applied influence more largely performance of the small type vibration wave actuator, and hence variation in the performance of the small type vibration wave actuator increases.

In addition, in a manufacturing method for the conventional laminated piezoelectric element, the amount of capital investment for a manufacturing apparatus relating to molding of the green sheet made of the piezoelectric material powder, laminating press, mechanical working, and the like is also large, which contributes to an increase of manufacturing cost.

With this regard, as in the above-mentioned conventional example as described in Japanese Patent No. 2,842,448, it is also conceivable that, at the same time when the laminated piezoelectric element is manufactured, without providing the adhesive layer, the laminated piezoelectric element is directly fixed (joined) on the vibrating plate.

However, the vibrating plate is made of a metal, and hence, at a temperature at which the piezoelectric layers and the electrode layers of the piezoelectric element are co-calcined to be integrated to each other, elements forming the metal are diffused into the piezoelectric layers and the electrode layers.

Consequently, due to the diffused elements, a chemical composition of the piezoelectric layer is unfortunately changed so as not to have an inherent piezoelectric active property.

Further, in the ceramic substrate having thermal resistance larger than that of the metal, the diffusion of the elements does not occur unlike the metal. However, between the electrode layer made of a noble metal and the ceramic substrate being in direct contact with the electrode layer, there are few chemical reactions, and hence the joining strength decreases to a large degree.

Therefore, the electrode layer may be peeled from the ceramic substrate from the beginning or peeling due to vibration is easy to occur. Therefore, there arises a case where stable vibration energy cannot be output.

SUMMARY OF THE INVENTION

Therefore, the present invention has been made in view of the above-mentioned problems, and it is an object of the present invention to provide a vibrating body and a vibration wave actuator, which are capable of suppressing vibration attenuation along with a reduction in size with an inexpensive structure, to thereby improve vibration efficiency, and of outputting stable vibration energy.

The present invention provides a vibrating body and a vibration wave actuator structured as follows.

A vibrating body according to the present invention includes: a piezoelectric element including a piezoelectric layer and an electrode layer; a ceramic substrate to which the piezoelectric element is fixed and which includes a ceramic including a main component which is different from that of a ceramic forming the piezoelectric layer; and a ceramic layer including as the main component the same main component of the ceramic substrate, which is provided between the piezoelectric element and the ceramic substrate, in which the piezoelectric element is fixed to the ceramic substrate through intermediation of the ceramic layer.

Further, a vibration wave actuator according to the present invention includes the vibrating body described above as a driving power source.

The present invention may thus realize a vibrating body and a vibration wave actuator, which are capable of suppressing vibration attenuation along with a reduction in size with an inexpensive structure, to thereby improve the vibration efficiency, and of outputting the stable vibration energy.

Further features of the present invention will become apparent from the following description of exemplary embodiments with reference to the attached drawings.

BRIEF DESCRIPTION OF THE DRAWINGS

FIGS. 1A, 1B and 1C are structural diagrams illustrating a structure of a vibrating body according to a first embodiment or a third embodiment of the present invention: FIG. 1A is a front view; FIG. 1B is a side view; and FIG. 1C is a plan view.

FIGS. 2A, 2B and 2C are structural diagrams illustrating a structure of a vibrating body according to a second embodiment of the present invention: FIG. 2A is a front view; FIG. 2B is a side view; and FIG. 2C is a plan view.

DESCRIPTION OF THE EMBODIMENTS (First Embodiment)

Figure 3:
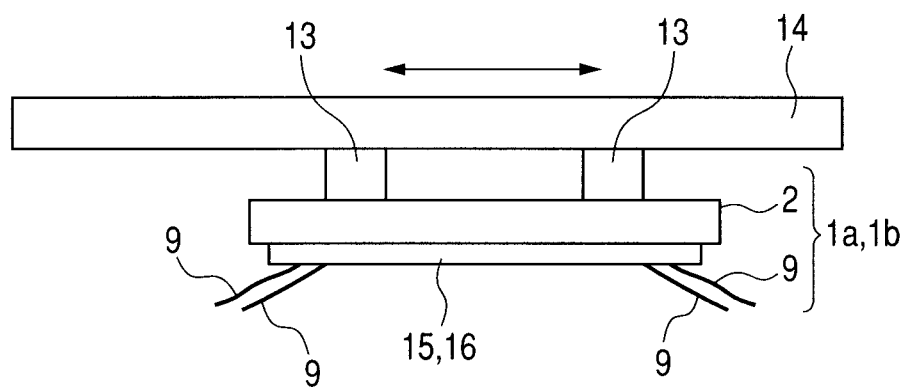
FIG. 3 is a view illustrating a driving mechanism of a linear type vibration wave actuator incorporating the vibrating body according to the first embodiment, the second embodiment, or the third embodiment of the present invention.
Figure 4:
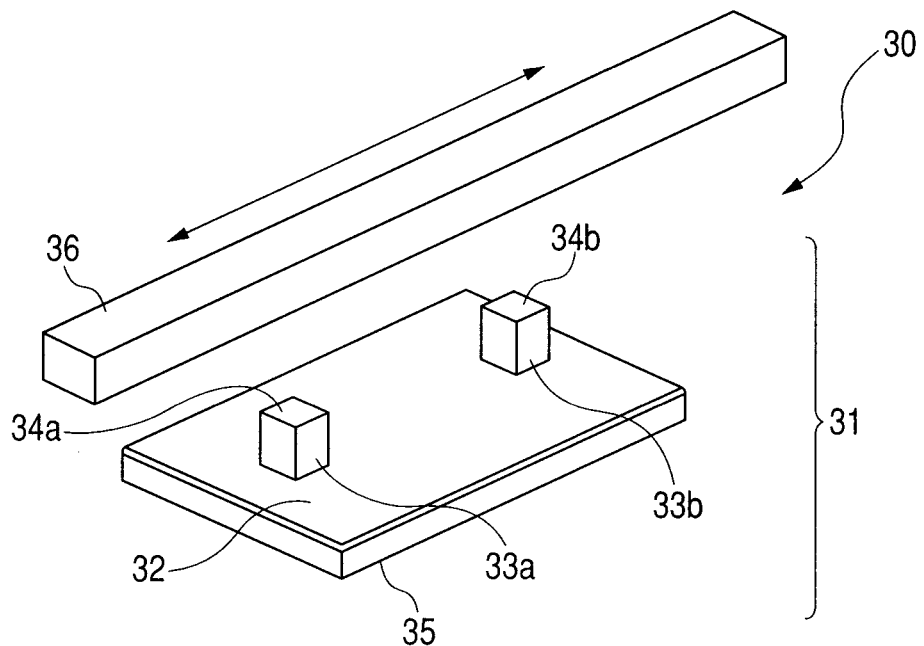
FIG. 4 is a view illustrating a structure of a linear type vibration wave actuator in a conventional example.

Referring to FIGS. 1A to 1C, a structure of a vibrating body according to a first embodiment of the present invention is described.

Note that, FIG. 1B illustrates a section of a portion illustrated by the dashed line indicated by the arrow of FIG. 1C. A vibrating body 1a illustrated in FIGS. 1A to 1C is envisaged to be applied to a linear driving vibration wave actuator.

The vibrating body 1a includes a plate-like ceramic substrate 2 and a piezoelectric element 15. Between the plate-like ceramic substrate 2 and the piezoelectric element 15, a ceramic layer 20 is provided.

The ceramic substrate 2 and the piezoelectric element 15 are fixed to be integrated to each other through intermediation of the ceramic layer 20 by co-firing as described below.

That is, the piezoelectric element 15 functioning as a vibration energy generating source and the ceramic substrate 2 functioning as a vibrating plate for accumulating the generated vibration energy are fixed to be integrated to each other through intermediation of the ceramic layer 20.

In the piezoelectric element 15, a piezoelectric layer 3, an electrode layer 4, a piezoelectric layer 5, an electrode layer 6, and a piezoelectric layer 7 are alternately laminated on each other.

The electrode layer 4 is divided into two parts, and the divided parts are provided while being away from each other. Similarly, the electrode layer 6 is divided into two parts, and the divided parts are provided while being away from each other.

Further, the piezoelectric layer 5 covers the entire surfaces on the same side of the electrode layers 4, and the piezoelectric layer 7 covers the entire surfaces on the same side of the electrode layers 6.

Electrical conduction between the electrode layers 4 and 6 and the outside (control portion or the like) is achieved as follows. Specifically, the piezoelectric layers 5 and 7 are provided with holes 8, and leads 9 are introduced through those holes 8 to the electrode layers 4 and 6 and are fixed thereon by soldering or the like, respectively.

It should be noted that the piezoelectric element may not include the piezoelectric layer 3 and the piezoelectric layer 7, which are a piezoelectric non-active portion as described below, and the piezoelectric layer 3 and the piezoelectric layer 7 are desirably provided depending on need.

To the electrode layers 4 and 6, alternate signals are supplied from the control portion or the like for controlling vibration of the piezoelectric element 15. In response to the alternate signals, the piezoelectric layer 5 is stretched and shrunk (strained). The stretching and shrinking of the piezoelectric layer 5 are released as mechanical vibration energy to the outside.

By the mechanical vibration energy, the ceramic substrate 2 is vibrated through the ceramic layer 20. The vibration of the ceramic substrate 2 is utilized as driving force for driving a driven member (see linear slider 14 in FIG. 3).

The ceramic substrate 2 has a length of 12 mm, a width of 5 mm, and a thickness of 0.3 mm.

Further, the piezoelectric layer 3 has a thickness of about 6 μm, the piezoelectric layer 5 has a thickness of about 12 μm, the piezoelectric layer 7 has a thickness of about 6 μm, and the electrode layers 4 and 6 each have a thickness of about 5 μm.

Further, the ceramic layer 20 has a thickness of about 5 μm, and the holes 8 for conduction each have a diameter of 1 mm.

Next, a manufacturing method for the vibrating body 1a is described.

First, a plate-like calcined ceramic is finished to have a predetermined dimension by grinding or cutting.

Next, a ceramic powder paste capable of being formed into a thick film is obtained by mixing ceramic powder with an organic vehicle formed of an organic solvent and an organic binder. The ceramic powder paste is applied in a printing manner to a surface on one side of the ceramic substrate 2 by screen printing.

The ceramic powder includes a main component which is different from that of a piezoelectric ceramic forming the piezoelectric layer and which is the same as that of the ceramic substrate. The ceramic powder includes a component forming a glass material.

Then, the applied ceramic powder paste is heated for about 10 minutes at about 150° C., and thus the organic solvent is removed and the applied ceramic powder paste is dried, to thereby form the ceramic layer 20.

In addition, a piezoelectric material powder paste capable of being formed into a thick film is obtained by mixing piezoelectric material powder with an organic vehicle formed of an organic solvent and an organic binder. The piezoelectric material powder paste is applied in a printing manner to a surface of the ceramic layer 20 by screen printing.

Then, the applied piezoelectric material powder paste is heated for about 10 minutes at about 150° C., and thus the organic solvent is removed and the applied piezoelectric material powder paste is dried, to thereby form the piezoelectric layer 3.

After that, a conductive material powder paste including conductive material powder is applied on the dried piezoelectric layer 3 by screen printing and dried, to thereby form the electrode layers 4.

As described above, application and drying are subsequently repeated, to thereby form the piezoelectric layer 5, the electrode layers 6, and the piezoelectric layer 7.

Note that, the conductive material powder paste is obtained by mixing conductive material powder with an organic vehicle formed of an organic solvent and an organic binder.

As the piezoelectric material for forming the piezoelectric layers 3, 5, and 7, the following material is used. That is, there is used three-component piezoelectric material powder or multi-component piezoelectric material powder obtained by being added by a small amount with a compound including multiple metal elements while including lead zirconate and lead titanate ($PbZrO_3$—$PbTiO_3$) as main components so as to obtain solid solution thereof, which has a perovskite crystal structure including lead. That is, the piezoelectric layers 3, 5, and 7 are formed as compound layers.

The piezoelectric layer 5 is a layer subjected to poling, for causing a displacement as a piezoelectric active portion, and hence a piezoelectric property given by components of the piezoelectric layer 5 affects directly performance of the vibration wave actuator. Meanwhile, the piezoelectric layer 3 and the piezoelectric layer 7 serve not as the piezoelectric active portion but as the piezoelectric non-active portion.

Note that, regarding the piezoelectric element 15, on a side fixed to the ceramic substrate 2, the piezoelectric layer 3 serving as the piezoelectric non-active portion may be formed on the ceramic layer 20 as in FIGS. 1A and 1B, or the electrode layers 4 may be directly formed on the ceramic layer 20. The ceramic layer 20 includes a component forming a glass material in a grain boundary of a ceramic as described below, and hence the ceramic layer 20 is easy to be chemically coupled to the piezoelectric layer 3 and the electrode layer 4.

Further, on a surface of the side fixed to the ceramic substrate and a surface of the opposite side of the ceramic layer 20, there may be formed another piezoelectric layer 7 serving as the piezoelectric non-active portion.

In addition, regarding the piezoelectric layer 5 and the piezoelectric layers 3 and 7, depending on object thereof, it is also possible to change components other than a main component of lead zirconate and lead titanate ($PbZrO_3$—$PbTiO_3$). Further, the piezoelectric layer 5 may have a thickness different from that of the piezoelectric layers 3 and 7.

The above-mentioned piezoelectric active portion means a portion of the piezoelectric layer, which has an electrode opposite to an electrode of another piezoelectric layer, and generates vibration energy for deforming a vibrator when alternate voltage is supplied between the electrodes after voltage is applied between the electrodes to perform poling.

Meanwhile, the piezoelectric non-active portion means a portion of the piezoelectric layer, which does not have an electrode opposite to an electrode of another piezoelectric layer so that voltage cannot be applied between the electrodes (that is, poling is impossible) and alternate voltage cannot be also supplied between the electrodes (that is, the vibration energy for deforming the vibrator is not generated).

Note that, the piezoelectric non-active portion also means a portion of the piezoelectric layer, which have an electrode opposite to an electrode of another piezoelectric layer so that voltage can be applied between the electrodes to perform poling but alternate voltage cannot be supplied between the electrodes because one of the electrodes is removed after the poling (that is, the vibration energy for deforming the vibrator is not generated).

Here, as the conductive material powder paste for forming the electrode layers 4 and 6, there is used one that is previously added with the piezoelectric material powder for 5% by weight to 10% by weight in addition to the conductive material including silver and palladium as main components.

It should be noted that the added piezoelectric material powder may include the same component as that for the piezoelectric layer 5, or lead zirconate and lead titanate ($PbZrO_3$—$PbTiO_3$) including the same main components as those for the piezoelectric layer 5, which still provides the similar effect. Further, the piezoelectric layers 5 and 7 are allowed to include the holes 8 (unprinted portions) through previously working a printing plate for screen printing. The electrode layers 4 and 6 are divided through the unprinted portions of the printing plate for screen printing. In this manner, the electrode layers 4 are allowed to be arranged away from each other, and the electrode layers 6 are allowed to be arranged away from each other.

The ceramic layer 20 (on the sintered ceramic substrate 2) formed as described above, the multiple laminated piezoelectric layers 3, 5, and 7, and the electrode layers 4 and 6 are held in an uncalcined state. Thus, the multiple laminated piezoelectric layers 3, 5, and 7 and the electrode layers 4 and 6 are heated within an electric furnace at a range of from 200° C. to 500° C. to remove the organic binder. Then, the multiple laminated piezoelectric layers 3, 5, and 7 and the electrode layers 4 and 6 are calcined under lead atmosphere at a range of from 1,100° C. to 1,200° C.

That is, the piezoelectric layers 3, 5, and 7, the electrode layers 4 and 6, the ceramic layer 20, and the ceramic substrate 2 are co-calcined to be integrated to each other. In other words, manufacture of the piezoelectric element and fixation between the piezoelectric element and the ceramic substrate are performed at the same time.

As a material for the ceramic substrate 2 as the vibrating body, it is preferred to employ a ceramic being a material capable of performing a stable chemical coupling in a region in vicinity of the piezoelectric layer 3 and the electrode layers 4.

In particular, for example, it is more preferred to employ aluminum oxide (alumina) that is easily available and is inexpensive because aluminum oxide (alumina) is a material exhibiting less vibration attenuation (exhibiting less energy loss as the vibrating body) than in a metal.

However, in aluminum oxide (alumina) with the purity of 99.5% by weight or less including a glass component such as silicon oxide, a mechanical strength decreases according to a decrease of the purity in comparison with alumina with the purity ranging from 99.6% by weight to 99.99% by weight. Similarly, in aluminum oxide (alumina) with the purity of 99.5% by weight or less including a glass component such as silicon oxide, vibration attenuation tends to increase.

Therefore, alumina with the purity ranging from 99.6% by weight to 99.99% by weight is more preferred as the vibrating body.

It should be noted that, when alumina with high purity ranging from 99.6% by weight to 99.99% by weight, including less a glass component such as silicon oxide, is used, peeling occurs in the following case.

That is, it has been found that, in a case of directly fixing the ceramic substrate 2 and the piezoelectric layer 3 or the electrode layers 4 to each other (not through intermediation of the ceramic layer 20), the ceramic substrate 2 and the piezoelectric layer 3 or the electrode layers 4 may be peeled when receive vibration.

That is probably because, with alumina with high purity, less chemical coupling occurs between the piezoelectric layer 3 and the electrode layers 4, and hence coupling force therebetween is less.

With this regard, when alumina with the high purity ranging from 99.6% by weight to 99.99% by weight is used, the ceramic layer 20 is provided to couple the ceramic substrate 2 and the piezoelectric layer 3 or the electrode layers 4.

That is, the ceramic powder includes, in addition to alumina having the same main component as that of the ceramic substrate, 0.5% by weight or more of a component forming, in a crystal grain boundary of the alumina, a glass material having low melting point after firing. In this case, the glass material includes calcium oxide, magnesium oxide, and the like (those materials are called sintering agent) while including silicon oxide as a main component.

Silver and palladium, which constitutes the conductive material for forming the electrode layers 4, exert only substantially low joining force with respect to the already calcined ceramic substrate.

Therefore, without the ceramic layer 20, due to contraction resulting from sintering of the powder during firing and to thermal expansion after firing, the electrode layers 4 may be peeled from the ceramic substrate 2 from the beginning or when the piezoelectric element 15 vibrates.

With this regard, through intermediation of an alumina layer being uncalcined powder, silver and palladium in the electrode layers, which are similarly uncalcined powder, are allowed to be diffused and reacted to each other, to thereby increase the joining force.

In addition, by mixing piezoelectric powder into the electrode layers 4 in advance, contraction resulting from firing of the conductive material powder is suppressed. In this manner, peeling force by which the electrode layers 4 are peeled from the ceramic substrate 2 is decreased, and the electrode layers 4 are not allowed to be easily peeled from the ceramic substrate 2.

In addition, at the same time, reaction between the mixed piezoelectric powder and the ceramic layer can be also expected (as follows).

Further, the piezoelectric layer 3 may be provided on the ceramic layer 20, and the electrode layers 4 may be provided on the piezoelectric layer 3.

In this case, a glass material including silicon oxide as a main component in the ceramic layer 20 and mainly lead in the piezoelectric powder are directly reacted to each other to form a glass material with lead, and hence larger coupling force can be generated.

In addition, regarding the piezoelectric layer 3 and the electrode layers 4, diffusion and reaction occur between the uncalcined powder in the piezoelectric layer 3 and the uncalcined powder in the electrode layers 4. At the same time, the piezoelectric powder including substantially the same component, which is mixed in the electrode layers 4, also reacts. Thus, the joining force is generated between the piezoelectric layer 3 and the electrode layers 4.

Meanwhile, main components of the ceramic substrate 2 and the ceramic layer 20 are the same material. Therefore, uncalcined fine powder particles forming the ceramic layer 20 grow to larger crystal particles by firing. At the same time, the uncalcined fine powder particles can be easily coupled to the crystal particles forming the ceramic substrate, which have been already calcined.

The glass material including silicon oxide as a main component, which is added to the ceramic layer 20, is also molten. Thus, a coupling effect between the ceramic layer 20 and the ceramic substrate 2 is exerted.

It should be noted that, if a sintering agent forming the glass material including silicon oxide as a main component is less than 0.5% by weight, the fixing effect is low. If the sintering agent forming the glass material including silicon oxide as a main component exceeds 8.0% by weight, silicon oxide is excessively diffused in the piezoelectric layers and the electrode layers. Therefore, the piezoelectric property of the piezoelectric layer is deteriorated. Further, a mechanical characteristic of the ceramic layer including alumina is deteriorated.

As described above, it has been also found that the sintering agent forming the glass material including silicon oxide as a main component is desirably set to range from 0.5% by weight to 8.0% by weight.

Further, an alumina ceramic has also a property of being slightly fragile as a mechanical component. Therefore, other components other than the glass component may be added in the alumina ceramic to a certain degree.

For example, zirconium oxide is capable of improving mechanical strength and an electric insulation property, and hence is preferred as an additive.

In this case, as in Japanese Patent Application Laid-Open No. 2006-74850, it is desirable to add zirconium oxide ranging from 5% by weight to 40% by weight.

In addition, the piezoelectric layer 5 covers the electrode layers 4, and the piezoelectric layer 7 covers the electrode layers 6. In particular, the electrode layers 4 and 6 are entirely covered up to end portions thereof. In this manner, the electrode layers 4 and 6 are not exposed to an upper surface of the vibrating body through using the piezoelectric layers 5 and 7 as insulating protective layers thereof.

As described above, the piezoelectric layers 5 and 7 are provided as the protective layers for the electrode layers 4 and 6, and hence it is also possible to prevent the electrode layers 4 and 6 from being peeled due to mechanical force added from the outside.

Further, it is possible to prevent, for example, short circuit when a foreign matter comes into contact with the electrode layers 4 and 6, and current leakage under high humidity, as well as moisture infiltration into gaps between the electrode layers 4 and 6 and the piezoelectric layer 5 and 7. It is also possible to prevent the electrode layers 4 and 6 from being peeled. Note that, in the first embodiment, the piezoelectric layer 5 serves as the piezoelectric active portion sandwiched between the electrode layers 4 and 6 respectively opposed to each other.

As described above, the piezoelectric layers 3, 5, and 7, the electrode layers 4 and 6, the ceramic substrate 2, and the ceramic layer 20 are co-calcined to be integrated to each other.

After that, through the holes 8 of the piezoelectric layers 3, 5, and 7, the leads 9 are fixed to the electrode layers 4 and 6 by soldering or the like. Then, voltage is applied between the electrode layers 4 and 6, and the piezoelectric layers 4 are subjected to poling.

The following condition for poling is employed. Specifically, in oil at a temperature ranging from 120° C. to 150° C., the electrode layers 4 are set to the ground (G) and the electrode layers 6 are set to be positive (+). A predetermined voltage of about 35 V (corresponding to 3 KV/mm) is applied. Thus, poling is performed for about 30 minutes.

Further, the piezoelectric material powder paste forming the piezoelectric layers 3, 5, and 7 and the electrode layers 4 and 6 is obtained as follows. Specifically, some additive is added to the piezoelectric material powder, and an organic vehicle using an organic binder such as ethylcellulose and an organic solvent such as terpineol are mixed with three rolls.

In screen printing, in this embodiment, the thickness of one of the piezoelectric layers is set to 12 μm. However, it is possible to highly accurately manufacture the piezoelectric layers and the electrode layers, which are thick films each having the thickness ranging from about 2 μm or 3 μm to about 30 μm.

It is also possible to provide divided electrodes to a printing plate and to form holes (unprinted portions) in the piezoelectric layers. Similarly, the thickness of the ceramic layer may be also changed.

Further, by the screen printing, it is not only easy to form a layer having a thinner and more highly accurate thickness as compared to the above-mentioned green sheet lamination, but also possible to highly accurately control an application position of the paste. In addition, mechanical working after sintering is even not required.

Further, a manufacturing installation is more inexpensive. As a result, the manufacturing cost is also inexpensive.

(Second Embodiment)

Referring to FIGS. 2A to 2C, a structure of a vibrating body according to a second embodiment of the present invention is described.

Note that, FIG. 2B illustrates a section of a portion illustrated by the dashed line indicated by the arrow of FIG. 2C.

In the first embodiment described above, one piezoelectric layer is sandwiched between the electrode layers. Meanwhile, in the second embodiment, two piezoelectric layers are respectively sandwiched between the electrode layers.

That is, in the second embodiment, a laminated piezoelectric element 16 is provided through adding another piezoelectric layer and another electrode layer with respect to the first embodiment.

In other words, in the second embodiment, two piezoelectric layers as piezoelectric active portions are used, and hence lower voltage operation is achieved in comparison with the first embodiment in which the one piezoelectric layer is used.

Note that, three or more piezoelectric layers as piezoelectric active portions may be used so that a further lower voltage operation may be achieved.

In a vibrating body 1*b* of this embodiment, specifically, on a plate-like calcined ceramic substrate 2, the following members are laminated on each other through intermediation of a ceramic layer 20. More specifically, a piezoelectric layer 3, electrode layers 4, a piezoelectric layer 5*a*, electrode layers 6*a*, a piezoelectric layer 5*b*, electrode layers 6*b*, and a piezoelectric layer 7 are laminated one by one as a laminated piezoelectric element 16.

The piezoelectric layer 5*a* covers the entire surfaces on the same side of the electrode layers 4. The piezoelectric layer 5*b* covers the entire surfaces on the same side of the electrode layers 6*a*. The piezoelectric layer 7 covers the entire surfaces on the same side of the electrode layers 6*b*.

The electrode layers 4 and 6*b* are electrically conducted to each other through holes 10 filled with the conductive material powder paste (conductive material), and are allowed to be conducted to an external power source through leads 9 fixed in holes 11.

The electrode layers 6*a* are allowed to be conducted to the outside (control portion or the like) through leads 9 fixed in holes 12 filled with the conductive material powder paste.

In the vibrating body 1*b* according to this embodiment, for example, the ceramic substrate 2 has a length of 12 mm, a width of 5 mm, and a thickness of 0.3 mm.

Further, the piezoelectric layer 3 has a thickness of about 6 μm, the piezoelectric layers 5*a* and 5*b* each have a thickness of about 12 μm, and the piezoelectric layer 7 has a thickness of about 6 μm.

Further, a thickness of each of the electrode layers 4, 6*a*, and 6*b* is set to about 5 μm and a thickness of the ceramic layer 20 is set to 5 μm. Further, a diameter of each of the holes 10 and 11 is set to 3 mm, taking wiring under consideration.

Note that, in this embodiment, the piezoelectric layers 5*a* and 5*b* serve as the piezoelectric active portions.

In this embodiment, unlike the first embodiment, the holes 10, 11, and 12 are filled with a conductive material powder paste having substantially the same component as that of the conductive material powder paste forming the electrode layers 4, 6*a*, and 6*b*.

In this case, when the holes 10, 11, and 12 has been formed, the holes 10, 11, and 12 are filled with the conductive material powder paste by screen printing or the like before or after the electrode layers 4, 6*a*, and 6*b* are formed. Then, together with the laminated piezoelectric element 16, the ceramic substrate 2 and the ceramic layer 20 are calcined to be integrated to each other.

Further, as another manufacturing method, after the laminated piezoelectric element 16 is calcined, the conductive material powder paste obtained by mixing a thermosetting adhesive and conductive powder may be filled in the holes 10, 11, and 12.

Here, similarly to the first embodiment, the piezoelectric layer 3 and the piezoelectric layer 7 may be omitted in some cases.

FIG. 3 is a view illustrating a structure of a linear type vibration wave actuator incorporating the vibrating plate 1*a* according to the first embodiment or the vibrating plate 1*b* according to the second embodiment.

A principle of linear driving is the same as that in the conventional example. The vibrating plate 1*a* or the vibrating plate 1*b* is provided with protrusions 13.

The linear slider 14 is brought into contact with the protrusions 13 under a state in which the linear slider 14 is pressed. Due to oval motion excited to the protrusions 13 due to vibration of the piezoelectric element 15 or 16, the linear slider 14 is moved.

That is, the linear type vibration wave actuator drives the linear slider 14 to reciprocate through using the piezoelectric element 15 or 16 as a driving power source.

Note that, the present invention is not limited to structures described in the above-mentioned first embodiment and second embodiment.

For example, in the above-mentioned embodiments, conduction between the electrode layers and the external power source is performed through the leads. However, in place of the leads, a flexible circuit board or a conductive material powder paste may be used to achieve conduction between the electrode layers and the external power source.

(Third Embodiment)

Referring to FIGS. 1A to 1C, a structure of a vibrating body according to a third embodiment of the present invention is described. The third embodiment is different from the first embodiment in that the ceramic layer 20 of the first embodiment is substituted by a ceramic layer 20' including glass powder.

FIG. 1B illustrates a section taken along the dashed line indicated by the arrow of FIG. 1C. A vibrating body 1c illustrated in FIGS. 1A to 1C is envisaged to be applied to a linear-driving vibration wave actuator.

The vibrating body 1c includes a plate-like ceramic substrate 2 and a piezoelectric element 15. Between the plate-like ceramic substrate 2 and the piezoelectric element 15, the ceramic layer 20' is provided.

The ceramic substrate 2 and the piezoelectric element 15 are fixed (joined) to be integrated to each other through intermediation of the ceramic layer 20' by co-firing as described below.

That is, the piezoelectric element 15 functioning as a vibration energy generating source and the ceramic substrate 2 functioning as a vibrating plate for accumulating generated vibration energy are fixed to be integrated to each other through intermediation of the ceramic layer 20'.

In the piezoelectric element 15, a piezoelectric layer 3, an electrode layer 4, a piezoelectric layer 5, an electrode layer 6, and a piezoelectric layer 7 are alternately laminated on each other one by one.

The electrode layer 4 is divided into two parts, and the divided parts are provided while being away from each other. Similarly, the electrode layer 6 is divided into two parts, and the divided parts are provided while being away from each other.

Further, the piezoelectric layer 5 covers the entire surfaces on the same side of the electrode layers 4, and the piezoelectric layer 7 covers the entire surfaces on the same side of the electrode layers 6.

Electrical conduction between the electrode layers 4 and 6 and the outside (control portion or the like) is achieved as follows. Specifically, the piezoelectric layers 5 and 7 are provided with holes 8, and leads 9 are introduced through those holes 8 to the electrode layers 4 and 6 and are fixed thereon by soldering or the like, respectively.

Note that, the piezoelectric element 15 may not include the piezoelectric layer 7 and the piezoelectric layer 3, which is a piezoelectric non-active portion as described below, and the piezoelectric layer 3 and the piezoelectric layer 7 are desirably provided depending on need. That is, regarding the piezoelectric element 15, on a side fixed to the ceramic substrate 2, the piezoelectric layer 3 as the piezoelectric non-active portion may be formed on the ceramic layer 20' as in FIGS. 1A to 1C, or the electrode layers 4 may be directly formed on the ceramic layer 20' while omitting the piezoelectric layer 3 as the piezoelectric non-active portion.

To the electrode layers 4 and 6, alternate signals are supplied from the control portion or the like for controlling vibration of the piezoelectric element 15. In response to the alternate signals, the piezoelectric layer 5 is stretched and shrunk (strained). The stretching and shrinking of the piezoelectric layer 5 are released as mechanical vibration energy to the outside.

Due to the mechanical vibration energy, the ceramic substrate 2 vibrates through the ceramic layer 20'. The vibration of the ceramic substrate 2 is utilized as driving force for driving a driven member (see linear slider 14 in FIG. 3).

The ceramic substrate 2 has a length of 12 mm, a width of 5 mm, and a thickness of 0.3 mm.

Further, the piezoelectric layer 3 has a thickness of about 6 µm, the piezoelectric layer 5 has a thickness of about 12 µm, the piezoelectric layer 7 has a thickness of about 6 µm, and the electrode layers 4 and 6 each have a thickness of about 5 µm.

Further, the ceramic layer 20' has a thickness of about 5 µm, and the holes 8 for conduction each have a diameter of 1 mm.

Next, a manufacturing method for the vibrating body 1c is described.

First, a plate-like calcined ceramic is finished to have a predetermined dimension by grinding or cutting.

Next, a ceramic powder paste capable of being formed into a thick film is obtained by mixing ceramic powder with an organic vehicle formed of glass powder, an organic solvent, and an organic binder as described below. The ceramic powder paste is applied in a printing manner to a surface on one side of the ceramic substrate 2 by screen printing.

The ceramic powder includes a main component which is different from that of a piezoelectric ceramic forming the piezoelectric layer and which is the same as that of the ceramic substrate 2. The ceramic powder may include components different from the main component to a certain degree.

The glass powder includes silicon oxide and boron oxide. In addition, the glass powder is mixed with an additive such as bismuth oxide, alumina, alkali metal oxide or alkaline earth metal oxide, or another metal oxide, to thereby compound the glass powder to have a glass softening point suitable for firing temperature. Then, the glass powder is once molten, the molten glass is finely ground to have an average granule diameter ranging from 1 µm to 2 µm. Thus, the glass powder (also referred to as glass frit) obtained in the above-mentioned manner is used.

The glass powder of 0.5% by weight to 10% by weight with respect to the weight of ceramic powder is added to the ceramic powder, to thereby obtain the ceramic powder paste. By changing the compound ratio between silicon oxide and boron oxide, it is possible to change the glass softening point. Further, selection of added elements allows an increase in reaction between the ceramic powder paste and the substrate 2.

The glass powder has a small fixing effect in a case where the glass powder is less than 0.5% by weight with respect to the weight of the ceramic powder. Meanwhile, in a case where the glass powder exceeds 10% by weight with respect to the weight of the ceramic powder, diffusion of molten glass components into the ceramic substrate is large, which deteriorates a mechanical property of the substrate. Further, a mechanical property of the ceramic layer itself is also deteriorated. Therefore, the glass powder is set to range from 0.5% by weight to 10% by weight with respect to the weight of the ceramic powder.

During firing, the glass powder in the ceramic layer 20' is molten and softened to be fluidized. As a result, the ceramic powder is sintered. Further, the molten glass components of the glass powder concentrate in an interface between the substrate 2 and the ceramic layer 20' and an interface between the piezoelectric layer 3 and the ceramic layer 20' or in the interface between the substrate 2 and ceramic layer 20' and an interface between the electrode layers 4 and the ceramic layer 20'. Therefore, the substrate 2 and the piezoelectric layer 3 or the electrode layers 4 can be more strongly coupled to each other.

A difference between the third embodiment and the first embodiment is as follows. Specifically, in the first embodiment, the ceramic is used as a paste. The paste is obtained by evenly mixing, into alumina powder having the same main component as that of the ceramic substrate, fine powder forming a glass material having low melting point such as calcium oxide and magnesium oxide (sintering agent) while including silicon oxide as a main component. Meanwhile, in the third embodiment, a powder paste is obtained by adding and mixing, into the alumina powder, the glass powder (powder obtained by adding and mixing into the glass, which includes silicon oxide and boron oxide, an additive such as bismuth oxide, alumina, alkali metal oxide or alkaline earth metal oxide, or another metal oxide to be appropriately compound, and then by melting the glass before the molten glass is finely ground to have a average granule diameter ranging from 1 μm to 2 μm).

It is needless to say that the sintering agent and the glass powder according to the first embodiment and the third embodiment may be used together, and the sintering agent is capable of reducing an added amount of the glass powder. With this, deterioration of the substrate is prevented and the joining effect is large.

As an advantage of the glass powder, the glass powder may be manufactured separately to the ceramic. In this case, it is possible to easily adjust the glass components to have suitable sintering temperature and suitable mechanical strength. The glass powder is effective with respect to various piezoelectric materials other than three-component piezoelectric material powder or multi-component piezoelectric material powder. The three-component piezoelectric material powder or the multi-component piezoelectric material powder is obtained by being added by a small amount with a compound including multiple metal elements while including the above-mentioned lead zirconate and lead titanate ($PbZrO_3$—$PbTiO_3$) as main components so as to obtain solid solution thereof. The above-mentioned various piezoelectric materials include, for example, a lead-free piezoelectric material such as barium titanate or bismuth sodium titanate. Further, the glass powder is also effective with respect to a ceramic substrate of different type than the alumina to be described later. Thus, an applicable range of the glass powder extends.

As a disadvantage of the glass powder, there is a fear in that, in the case where the added amount is large as described above, there may occur deterioration of the substrate, deterioration of the piezoelectric property of the piezoelectric layer, and further, deterioration of the mechanical property of the ceramic layer.

Then, the applied ceramic powder paste mixed with the glass powder is heated for about 10 minutes at about 150° C., and thus the organic solvent is removed and the applied ceramic powder paste is dried, to thereby form the ceramic layer 20'.

In addition, a piezoelectric material powder paste capable of being formed into a thick film is obtained by mixing piezoelectric material powder with an organic vehicle formed of an organic solvent and an organic binder. The piezoelectric material powder paste is applied in a printing manner to a surface of the ceramic layer 20' by screen printing.

Then, the applied piezoelectric material powder paste is heated for about 10 minutes at about 150° C., and thus the organic solvent is removed and the applied piezoelectric material powder paste is dried, to thereby form the piezoelectric layer 3. It should be noted that the piezoelectric layer 3 may be omitted, and the piezoelectric layer 3 is desirably provided depending on need.

After that, a conductive material powder paste including conductive material powder is applied on the dried piezoelectric layer 3 or the ceramic layer 20' by screen printing and dried thereon, to thereby form the electrode layers 4. As described above, application and drying are repeated sequentially, to thereby form the piezoelectric layer 5, the electrode layers 6, and the piezoelectric layer 7.

Note that, the conductive material powder paste is obtained by mixing conductive material powder with an organic vehicle formed of an organic solvent and an organic binder.

As a piezoelectric material for forming the piezoelectric layers 3, 5, and 7, the following material is used. That is, there is used three-component piezoelectric material powder or multi-component piezoelectric material powder obtained by being added by a small amount with a compound including multiple metal elements while including lead zirconate and lead titanate ($PbZrO_3$—$PbTiO_3$) as main components so as to obtain solid solution thereof, which has a perovskite crystal structure including lead. That is, the piezoelectric layers 3, 5, and 7 are formed as compound layers.

The piezoelectric layer 5 is a layer subjected to poling, for causing a displacement as a piezoelectric active portion, and hence a piezoelectric property given by components of the piezoelectric layer 5 effects directly performance of the vibration wave actuator. Meanwhile, the piezoelectric layer 3 and the piezoelectric layer 7 serve not as the piezoelectric active portion but as the piezoelectric non-active portion.

Further, on a surface of the side fixed to the ceramic substrate 2 and a surface of the opposite side of the ceramic layer 20', there may be formed another piezoelectric layer 7 as the piezoelectric non-active portion.

In addition, regarding the piezoelectric layer 5 and the piezoelectric layers 3 and 7, depending on object thereof, it is also possible to change components other than the main components, that is, lead zirconate and lead titanate ($PbZrO_3$—$PbTiO_3$). Further, the piezoelectric layer may have a thickness different from that of the piezoelectric layers 3 and 7.

Here, as the conductive material powder paste for forming the electrode layers 4 and 6, there is used one that is previously added with the piezoelectric material powder ranging from 5% by weight to 10% by weight in addition to the conductive material including silver and palladium as main components. It should be noted that the added piezoelectric material powder may include the same component as that for the piezoelectric layer 5, or lead zirconate and lead titanate ($PbZrO_3$—$PbTiO_3$) including the same main components as those for the piezoelectric layer 5, which still provides the similar effect. Further, the piezoelectric layers 5 and 7 are allowed to include the holes 8 (unprinted portions) through previously working a printing plate for screen printing. The electrode layers 4 and 6 are divided into two parts through the unprinted portions of the printing plate for screen printing. In this manner, the electrode layers 4 are allowed to be arranged away from each other, and the electrode layers 6 are allowed to be arranged away from each other.

The ceramic layer 20' (on the sintered ceramic substrate 2) formed as described above, the multiple laminated piezoelectric layers 3, 5, and 7, and the electrode layers 4 and 6 are held in an uncalcined state. Thus, the ceramic layer 20', the multiple laminated piezoelectric layers 3, 5, and 7, and the electrode layers 4 and 6 are heated within an electric furnace at a range of from 200° C. to 500° C. to remove the organic binder. Then, the ceramic layer 20', the multiple laminated piezoelectric layers 3, 5, and 7, and the electrode layers 4 and 6 are calcined under lead atmosphere at a range of from 1,100° C. to 1,200° C.

That is, the piezoelectric layers 3, 5, and 7, the electrode layers 4 and 6, the ceramic layer 20', and the ceramic substrate 2 are co-calcined to be integrated to each other. In other words, manufacture of the piezoelectric element and fixation between the piezoelectric element and the ceramic substrate are performed at the same time.

Meanwhile, for a material for the ceramic substrate 2, the alumina is selected as a preferred material for the substrate as the vibrating plate. The alumina is, similarly to the first embodiment, a plate-like calcined ceramic.

It should be noted that, as the purity of the alumina decreases, the alumina decreases in mechanical strength and vibration attenuation as the vibrating body increases, and hence the alumina with high purity ranging from 99.6% by weight to 99.99% by weight is desirable.

Note that, the alumina has also a property of being slightly fragile as a mechanical component. Therefore, other components may be added in the alumina to a certain degree. For example, zirconium oxide is capable of improving mechanical strength and an electric insulation property, and hence is preferred as an additive.

In this case, as in Japanese Patent Application Laid-Open No. 2006-74850, it is desirable to add zirconium oxide ranging from 5% by weight to 40% by weight.

Further, the substrate 2 may be made of any material as long as the material is stably coupled to the ceramic layer 20' including the glass powder mixed therein in advance. In addition to the alumina, as a substrate, even in a case of a typical ceramic such as zirconia, silicon carbide, aluminum nitride, or silicon nitride, the ceramic layer 20' includes the glass powder mixed therein in advance. Therefore, contact strength between the substrate 2 and the electrode layers 4 or the piezoelectric layer 3 is increased due to the glass components molten by firing. Thus, the joining force can be increased.

Further, correspondingly to various ceramics, it is desirable to take, in addition to silicon oxide and boron oxide, the added element under consideration regarding the components of the glass powder.

In addition, the ceramic layer 20' also functions, together with the substrate 2 having the same main component, as a cushioning material against stress generated due to contraction during firing or due to differences in thermal expansion coefficient during temperature lowering after firing of the electrode layers 4 and 6 and the piezoelectric layers 3, 5, and 7. Thus, the ceramic layer 20' has an effect of preventing peeling between the substrate 2 and the electrode layers 4 or the piezoelectric layer 3. Further, during vibration of the vibrating body, the ceramic layer 20' also functions as a cushioning material for the substrate 2 against stress generated along with displacement of the piezoelectric layer 5 as the piezoelectric active layer. That is the case with the ceramic 20.

In addition, by mixing piezoelectric powder into the electrode layers 4 in advance, contraction resulting from firing of the conductive material powder is suppressed. In this manner, peeling force by which the electrode layers 4 are peeled from the ceramic substrate 2 is decreased, and the electrode layers 4 are not allowed to be easily peeled from the ceramic substrate 2.

As described above, the piezoelectric layers 3, 5, and 7, the electrode layers 4 and 6, the ceramic substrate 2, and the ceramic layer 20' are co-calcined to be integrated to each other. After that, through the holes 8 of the piezoelectric layers 3, 5, and 7, the leads 9 are fixed to the electrode layers 4 and 6 by soldering or the like. Then, voltage is applied between the electrode layers 4 and 6, and the piezoelectric layers 4 are subjected to poling.

The following condition for poling is employed. Specifically, in oil at a temperature ranging from 120° C. to 150° C., the electrode layers 4 are set to the ground (G) and the electrode layers 6 are set to be positive (+). A predetermined voltage of about 35 V (corresponding to 3 KV/mm) is applied and poling is performed for about 30 minutes.

Even in a case of the ceramic layer 20' including the glass powder, application of the paste in a printing manner by the screen printing, firing condition, poling condition, and the like are the same as those of the first embodiment. Further, in even in a case where two or more piezoelectric layers sandwiched between the electrode layers of the second embodiment are used, the ceramic layer 20' including the glass powder is applicable. In this case, characteristics of manufacture are also the same as those of the first embodiment.

FIG. 3 illustrates a structure of a linear type vibration wave actuator incorporating the vibrating plate 1c according to the third embodiment similarly to the first embodiment and the second embodiment.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2009-174891, filed Jul. 28, 2009 and No. 2010-140238, filed Jun. 21, 2010 which are hereby incorporated by reference herein in the entirety.

What is claimed is:

1. A vibrating body, comprising:
   a piezoelectric element comprising a first piezoelectric layer and an electrode layer;
   a ceramic substrate; and
   a ceramic layer comprising as a main component the same main component of the ceramic substrate,
   wherein the piezoelectric element is fixed to the ceramic substrate with the ceramic layer interposed between the piezoelectric element and the ceramic substrate,
   wherein the ceramic layer comprises glass,
   wherein the glass concentrates in an interface between the ceramic substrate and the ceramic layer and an interface between the ceramic layer and the piezoelectric element, and
   wherein the ceramic layer comprises at least one component which is different from components contained in the ceramic substrate.

2. The vibrating body according to claim 1,
   wherein concentrates of the glass are formed by melting glass powder in the ceramic layer.

3. The vibrating body according to claim 2,
   wherein the glass powder has been mixed into the ceramic layer and comprises silicon oxide and boron oxide, and
   wherein the ceramic layer comprises an additive in an amount at least ranging from 0.5% by weight to 10% by weight with respect to a weight of a ceramic.

4. The vibrating body according to claim 1,
   wherein the ceramic substrate and the ceramic layer each comprise alumina as a main component.

5. The vibrating body according to claim 1, wherein:
   at least a part of the first piezoelectric layer functions as a piezoelectric active portion;
   the first piezoelectric layer comprises lead zirconate and lead titanate as main components; and
   the electrode layer comprises as main components silver and palladium.

6. The vibrating body according to claim 5, wherein:
   the piezoelectric element further comprises a second piezoelectric layer between the first piezoelectric layer and the ceramic layer;
   at least a part of the second piezoelectric layer functions as a piezoelectric non-active portion; and
   the second piezoelectric layer comprises one of a compound layer comprising the same component as a component of the first piezoelectric layer and a compound layer comprising the same main component as a main component of the first piezoelectric layer.

7. The vibrating body according to claim 5, wherein:
   the piezoelectric element further comprises a second piezoelectric layer;

the first piezoelectric layer is between the ceramic layer and the second piezoelectric layer;

the second piezoelectric layer functions as a piezoelectric non-active portion; and the second piezoelectric layer comprises one of a compound layer comprising the same component as a component of the first piezoelectric layer and a compound layer comprising the same main component as a main component of the first piezoelectric layer.

8. The vibrating body according to claim 5, wherein the electrode layer comprises powder of one of a compound comprising the same component as a component of the first piezoelectric layer and a compound comprising the same main component as a main component of the first piezoelectric layer.

9. The vibrating body according to claim 1, wherein the ceramic substrate is constituted of one of a ceramic comprising alumina with a purity ranging from 99.6% by weight to 99.99% by weight and a ceramic comprising as a main component alumina with a purity ranging from 99.6% by weight to 99.99% by weight and being added with zirconia.

10. The vibrating body according to claim 1, wherein the ceramic layer comprises alumina and a glass component comprising silicon oxide in an amount at least ranging from 0.5% by weight to 8.0% by weight.

11. The vibrating body according to claim 1, wherein the electrode layer is electrically conductable to an outside of the piezoelectric element through a conductive material in a hole formed in the first piezoelectric layer.

12. A vibration wave actuator, comprising as a driving power source the vibrating body according to claim 1.

* * * * *